United States Patent
Chang et al.

(10) Patent No.: US 8,258,606 B2
(45) Date of Patent: Sep. 4, 2012

(54) HIGH FREQUENCY FLIP CHIP PACKAGE STRUCTURE OF POLYMER SUBSTRATE

(76) Inventors: Edward-yi Chang, Hsinchu (TW); Li-Han Hsu, Hsinchu (TW); Chee-Way Oh, Hsinchu (TW); Wei-Cheng Wu, Hsinchu (TW); Chin-te Wang, Hsinchu (TW)

( * ) Notice: Subject to any disclaimer, the term of this patent is extended or adjusted under 35 U.S.C. 154(b) by 0 days.

(21) Appl. No.: 13/085,602

(22) Filed: Apr. 13, 2011

(65) Prior Publication Data
US 2011/0186974 A1 Aug. 4, 2011

Related U.S. Application Data

(62) Division of application No. 12/547,575, filed on Aug. 26, 2009, now Pat. No. 8,033,039.

(30) Foreign Application Priority Data

Mar. 25, 2009 (TW) .............................. 98109702 A

(51) Int. Cl.
*H01L 23/50* (2006.01)
*H01L 29/40* (2006.01)
(52) U.S. Cl. ......... 257/664; 257/E21.503; 257/E21.511; 257/E23.079
(58) Field of Classification Search .................. 257/664, 257/E21.503, E23.079, E21.511
See application file for complete search history.

(56) References Cited

U.S. PATENT DOCUMENTS
2002/0097962 A1* 7/2002 Yoshimura et al. ............. 385/50
2007/0096337 A1* 5/2007 Choi ............................ 257/778
* cited by examiner

*Primary Examiner* — David S Blum
(74) *Attorney, Agent, or Firm* — Chun-Ming Shih

(57) ABSTRACT

A high frequency flip chip package substrate of a polymer is a one-layer structure packaged by a high frequency flip chip package process to overcome the shortcomings of a conventional two-layer structure packaged by the high frequency flip chip package process. The conventional structure not only incurs additional insertion loss and return loss in its high frequency characteristic, but also brings out a reliability issue. Thus, the manufacturing process of a ceramic substrate in the conventional structure still has the disadvantages of a poor yield rate and a high cost.

5 Claims, 6 Drawing Sheets

HIGH FREQUENCY FLIP CHIP PACKAGE STRUCTURE OF POLYMER SUBSTRATE

CROSS-REFERENCES TO RELATED APPLICATIONS

This application is a divisional application of the application Ser. No. 12/547,575, now U.S. Pat. No. 8,033,039, filed Aug. 26, 2009.

BACKGROUND OF THE INVENTION

1. Field of the Invention

The present invention relates to a high frequency flip chip package process of a polymer substrate and a structure thereof, and more particularly to a one-layer high frequency flip chip package for overcoming the shortcomings of a conventional two-layer high frequency flip chip package process by enhancing the issues such as the return loss, high cost, manufacturing yield rate and reliability of the package structure.

2. Background of the Invention

As the semiconductor industry advances rapidly, present electronic products tend to be designed with a small size, a light weight and a variety of functions, and package processes tend to be developed with a larger number of inputs/outputs and a smaller interval, so as to provide electronic components with a more stable signal transmission channel and a better heat dissipating path, while protecting the internal electronic components from being affected by external environments. Regardless of traditional electronic products, light emitting diodes (LEDs), mobile phones or other high-frequency wireless communication products, a package process plays an important role.

At present, the package process traditionally used in the semiconductor industry is a wire bonding process. As an operating frequency becomes increasingly higher, a lager parasitic effect results, and thus the wire bonding package has faced its bottleneck, and the two-layer high frequency flip chip package process is considered as a package process with the most potential.

With reference to FIG. 1 for a structure of the so-called two-layer high frequency flip package, a bump 24 is provided for connecting a chip 25 with a ceramic substrate 23 (which is the first-layer package), and then a ball grid array (BGA) 22 is used for connecting the ceramic substrate 23 with a polymer substrate 21 (which is the second-layer package), so as to complete a two-layer high frequency flip package structure 2.

However, the conventional two-layer high frequency flip chip package process and its structure 2 have the following drawbacks:

1. The conventional two-layer high frequency flip chip package process goes through two-layer package, and the high-frequency characteristics of the manufactured high frequency flip chip package structure 2 bring out additional insertion loss and return loss.

2. The conventional high frequency flip chip package process uses the two-layer package, and thus the package incurs a high cost and a complicated manufacturing process.

3. Since the polymer substrate 21 of the high frequency flip package structure 2 comes with a larger coefficient of thermal expansion (CTE), therefore there is a reliability issue.

4. The manufacturing process of the ceramic substrate 23 in the high frequency flip package structure 2 still has the issues of a low yield rate and a high cost.

In summation of the aforementioned drawbacks, the conventional two-layer high frequency flip chip package process still has many issues that require further improvements.

SUMMARY OF THE INVENTION

In summation of the aforementioned shortcomings of the prior art, the inventor of the present invention develops and designs a high frequency flip chip package process of a polymer substrate and its structure to achieve the effects of improving the additional insertion and return losses caused by the high-frequency characteristics of the structure packaged by the conventional two-layer high frequency flip chip package process, lowering the high cost and simplifying the complicated manufacturing process. The present invention also can enhance the reliability and the manufacturing yield rate and lower the manufacturing cost of the ceramic substrate.

Therefore, it is a primary objective of the present invention to overcome the shortcomings of the prior art by providing a high frequency flip chip package process of a polymer substrate and its structure, wherein the one-layer high frequency flip chip package process is used to overcome the shortcomings of the conventional two-layer high frequency flip chip package process having an additional return loss caused by the high-frequency characteristics of a two-layer high frequency flip chip package structure.

Another objective of the present invention is to provide a high frequency flip chip package process of a polymer substrate and its structure, wherein the one-layer high frequency flip chip package is used to overcome the shortcomings of the two-layer package produced by the conventional two-layer high frequency flip chip package process incurring a high cost and a complicated manufacturing process.

A further objective of the present invention is to provide a high frequency flip chip package process of a polymer substrate and its structure, wherein the one-layer high frequency flip chip package is used to overcome the shortcomings of the polymer substrate produced by the conventional two-layer high frequency flip chip package process having a larger coefficient of thermal expansion (CTE) and a reliability issue.

Another objective of the present invention is to provide a high frequency flip chip package process of a polymer substrate and its structure, wherein the one-layer high frequency flip chip package is used to overcome the shortcomings of the ceramic substrate produced by the conventional two-layer high frequency flip chip package process having a low manufacturing yield rate and a high cost.

DETAILED DESCRIPTION OF THE PREFERRED EMBODIMENTS

To make it easier for our examiner to understand the technical measures and the operating procedure of the present invention, we use preferred embodiments together with the attached drawing for the detailed description of the present invention.

Figure 2:
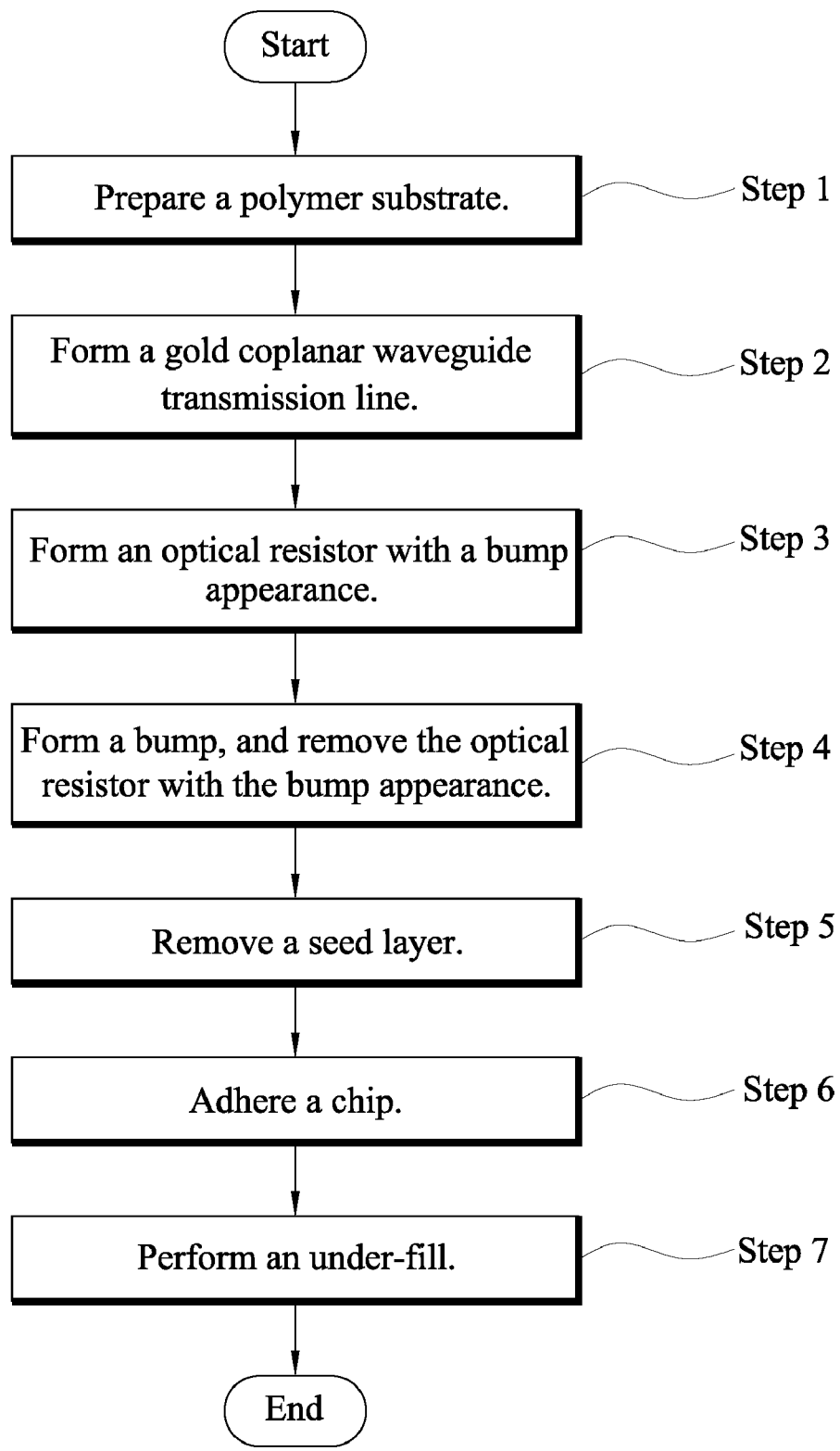
FIG. 2 is a flow chart of a one-layer high frequency flip chip package process in accordance with the present invention.
Figure 3:
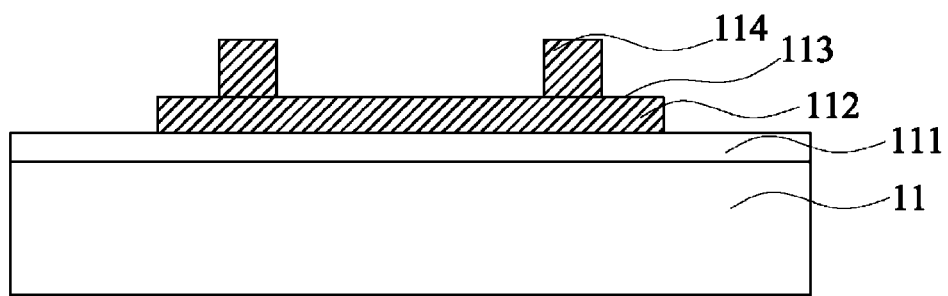
FIG. 3 is a schematic view of a one-layer high frequency flip chip package process in accordance with the present invention.
Figure 4:
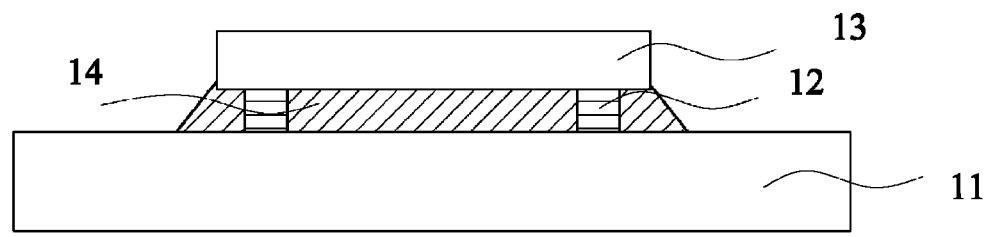
FIG. 4 is a schematic view of a one-layer high frequency flip chip package structure in accordance with the present invention.

The present invention provides a high frequency flip chip package process of a polymer substrate and a structure thereof, wherein a one-layer high frequency flip chip package is used for completing the one-layer high frequency flip chip package structure in accordance with the present invention. With reference to FIGS. 2 to 4, a one-layer high frequency flip chip package process comprises the following step:

Step 1: Prepare a polymer substrate 11 (which is a polymer substrate produced by Rogers Corporation in this embodiment). A mixed solution (which is a solution of water, sulfuric acid and hydrogen peroxide mixed in the proportion of 100: 5:6 in this embodiment) to etch the copper originally electrodeposited on both sides of the polymer substrate 11 to prepare and complete the polymer substrate 11 and polish the surface of the polymer substrate 11 by a chemical mechanical polishing to reduce the roughness and facilitate the following manufacturing process.

Step 2: Form a gold coplanar waveguide (CPW) transmission line. An e-gun evaporator deposits a predetermined thickness (which is 500 Å in this embodiment) of titanium (Ti) onto the polymer substrate 11 as an adhesion layer 111, and deposits another predetermined thickness (which is 2000 Å in this embodiment) of gold (Au) onto the adhesion layer 111 as a seed layer 112, and then a manufacturing process technology is used to coat a predetermined thickness (which is 2~3 µm this embodiment) of photoresist layer 113 (as shown in FIG. 3), and a first predetermined rotation speed (which is 1000 rpm in this embodiment) is used for performing a first rotary coating on the polymer substrate 11 for a first predetermined time (which is 10 seconds in this embodiment), and a second predetermined rotation speed (which is 3000 rpm in this embodiment) is used for performing a second rotary coating for a second predetermined time (which is 45 seconds in this embodiment), and the polymer substrate 11 is exposed to light by using an aligner for a third predetermined time (which is 13 seconds in this embodiment), and a heating plate is used for baking at a first predetermine temperature (which is 90 in this embodiment) for a fourth predetermined time (which is 20 minutes in this embodiment), such that the polymer substrate 11 and a developer solution (which is FHD-5 in this embodiment) are reacted, and then rinsed by deionized water (DI water) for a second predetermine temperature (which is 60 in this embodiment), and submerged into a gold cyanide electroplating solution for a fifth predetermined time (which is 15 minutes in this embodiment). In the meantime, a current (of 15 mA in this embodiment) is connected. A first solution (which is an acetone solution in this embodiment) is used for removing the photoresist layer 113. A second solution (which is an isopropyl alcohol (IPA) in this embodiment) is used for removing the first solution. The gold coplanar waveguide (CPW) transmission line (not shown in the figure) is provided for the transmission of telecommunication signals.

Step 3: Form a gold bump 114. A third predetermined rotation speed (which is 500 rpm in this embodiment) is used for performing a third rotary coating another photoresist for a sixth predetermined time (which is 60 seconds in this embodiment) onto the gold coplanar waveguide (CPW) transmission line, and then a fourth predetermined rotation speed (which is 2000 rpm in this embodiment) is used for performing a fourth rotary coating for a seventh predetermined time (which is 2 seconds in this embodiment), and being baked in an oven at a third predetermine temperature (which is 120 in this embodiment) for an eighth predetermined time (which is 10 minutes in this embodiment). This step is repeated to achieve a predetermined thickness (which is 30~40 µm in this embodiment), and the aligner is used for a light exposure for a ninth predetermined time (which is 140 seconds in this embodiment) to form the gold bump 114 (which is a PMERPHA900PM made by photolithographic process in this embodiment) (as shown in FIG. 4).

Step 4: Form a bump 12 and remove the gold bump 114. The polymer substrate 11 is reacted with another developer solution (which is a PMER Developer P-7G in this embodiment), and the polymer substrate 11 is rinsed by the deionized water (DI water), and submerged into a gold cyanide electroplating solution at a fourth predetermine temperature (which is 60 in this embodiment) for a tenth predetermined time (which is 3 hours in this embodiment), while connecting another current (which is 1 mA in this embodiment) for an electroplating to form the bump 12, and the first solution is used to remove the gold bump 114, and the second solution is used for removing the first solution.

Step 5: Remove the seed layer 112. A third solution (which is potassium iodide/iodide solution (KI/I2 solution) in this embodiment) is used for etching gold (Au) in the polymer substrate 11, and then a fourth solution (which is a hydrofluoric acid (HCl) and hydrogen fluoride (HF) solution in this embodiment) is used for removing titanium (Ti) in the polymer substrate 11 and the seed layer 112.

Step 6: Adhere a chip 13. A bonding machine (which is a RD automation M9 bonding machine in this embodiment) and a gold-gold thermo-compression bonding are used for performing a flip chip bonding to adhere the chip 13 onto the bump under the conditions of a fourth predetermined temperature (which is 250 in this embodiment), a bonding force of 150 gf and an eleventh predetermined time (which is 150 seconds in this embodiment) to complete a chip adhesion.

Step 7: Encapsulation: The polymer substrate 11 is preheated by the heating plate to a fifth predetermine temperature (which is 100 in this embodiment), and then an under-fill 14 (which is an epoxy-based under-fill in this embodiment) is filled into a space formed among the chip 13, the polymer substrate 11 and the bump 12 to reduce the thermal stress caused by the large difference of the coefficients of thermal expansion between the chip 13 and the polymer substrate 11, while producing a wicking effect to lower the viscosity of the under-fill 14, so as to expedite the flowing speed, and the polymer substrate 11 is heated in an oven at a sixth predetermine temperature (which is 150 in this embodiment) for a twelfth predetermined time (which is 2 hours in this embodiment) to complete the package process.

In the aforementioned process, the under-fill 14 is filled into the space between the chip 13, the polymer substrate 11 and the bump 12 by using a capillary method or another injection method.

Figure 1:
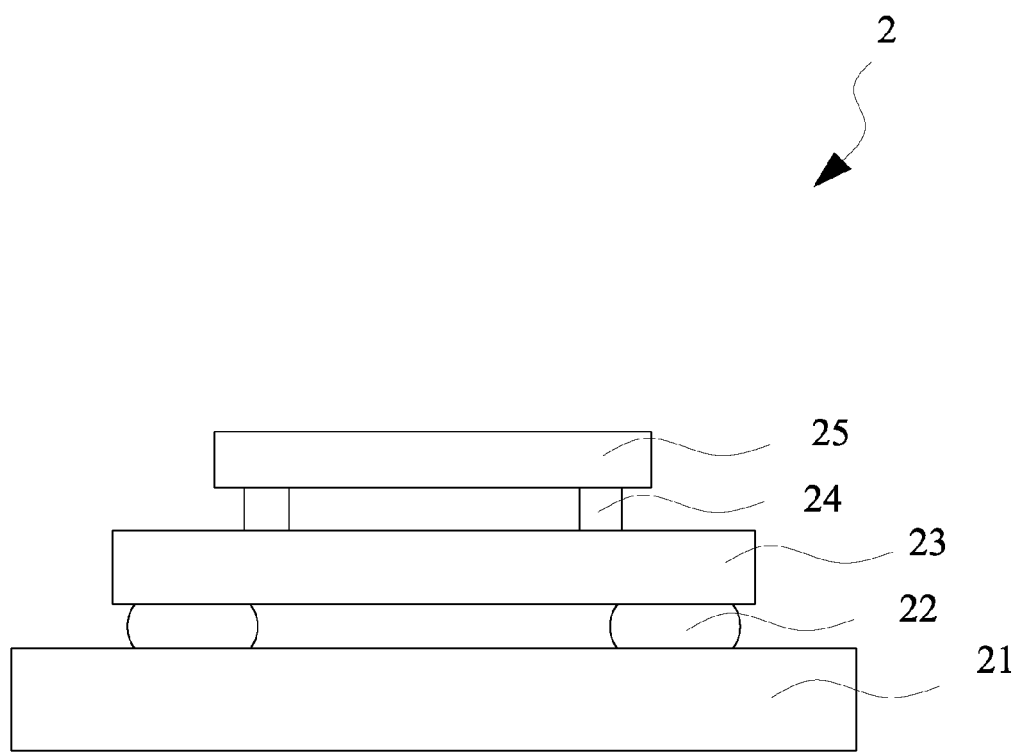
FIG. 1 is a schematic view of a conventional two-layer high frequency flip package structure.

With the following tests, it shows that one-layer the high frequency flip chip package structure 1 of the present invention can overcome the shortcomings of the conventional two-layer high frequency flip chip package process and the high frequency flip package structure 2 (as shown in FIG. 1) produced by the conventional process, including additional insertion and return losses caused by the high-frequency characteristics, and a reliability issue of the applications.

Figure 5:
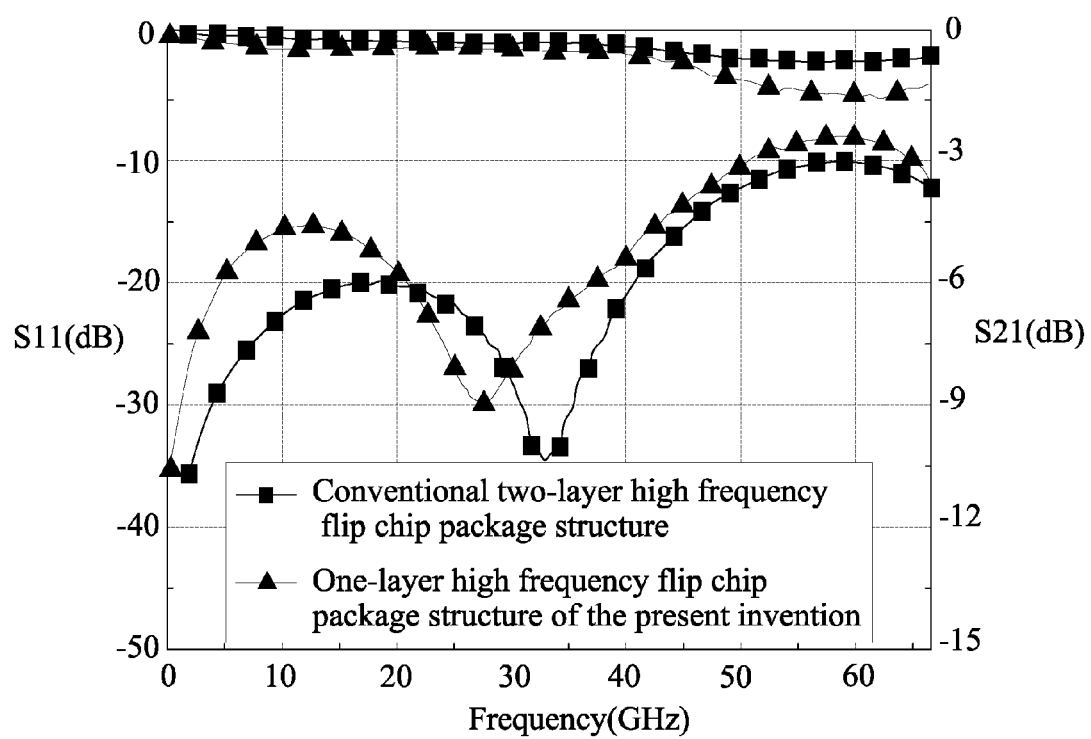
FIG. 5 shows measured results of S parameter versus frequency of a one-layer high frequency flip chip package structure in accordance with the present invention and a conventional ceramic substrate.

1. S-parameter Measurement:

With reference to FIGS. 4 and 5 for measured results of S parameters of a one-layer high frequency flip package structure 1 in accordance with the present invention and a conventional ceramic substrate, the measured S parameters show that from a direct current (DC) to 50 GHz, the one-layer high frequency flip package structure 1 of the present invention has a return loss less than 15 dB and an insertion loss less than 1.0 dB, and the conventional ceramic substrate has a return loss less than 18 dB and an insertion loss less than 0.8 dB. From the foregoing data, it shows that the one-layer high frequency flip package structure 1 of the present invention has a return loss and an insertion loss capable of achieving similar effects of the conventional ceramic substrate.

Figure 6:
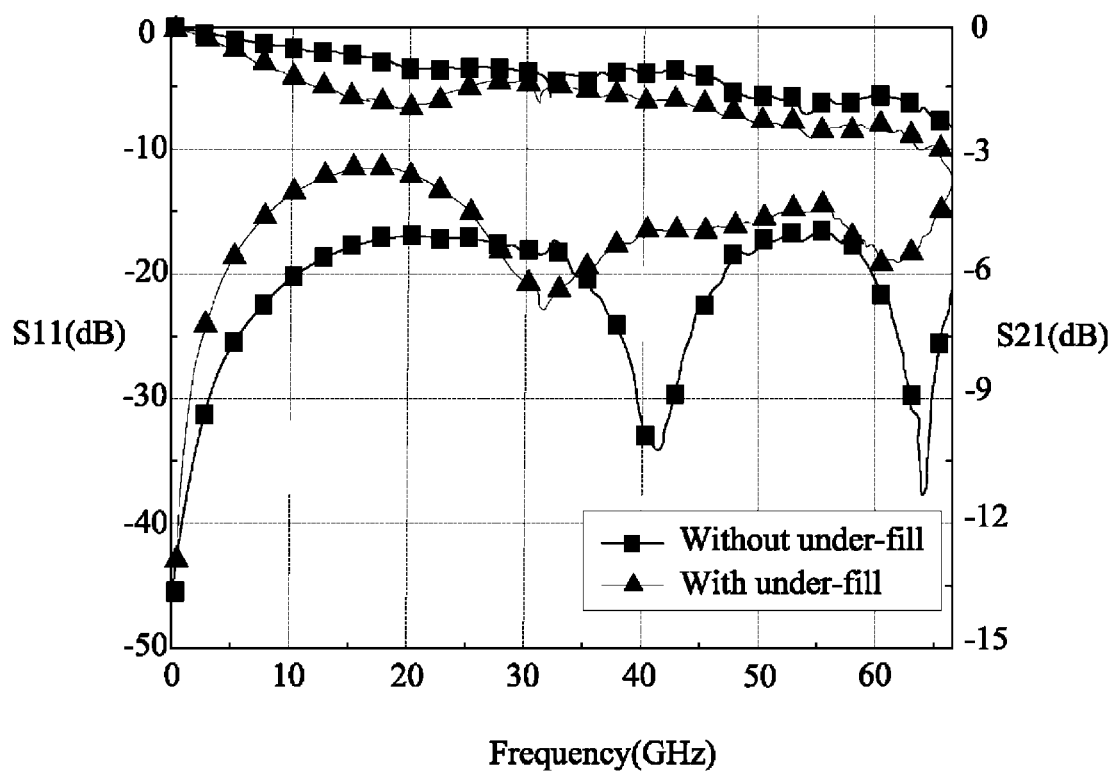
FIG. 6 shows measured results of reliability tests of a high frequency flip chip package structure in accordance with the present invention before and after an encapsulation takes place.

A high frequency flip package structure 1 of the present invention or a high frequency flip package structure produced by the high frequency flip chip package process of the present invention goes through the encapsulation step to measure the S-parameters. With reference to FIG. 6, the data measurement of S by direct current (DC) up to 50 GHz indicates that the high frequency flip package structure has a slightly lower high-frequency characteristic after the encapsulation step takes place, but such structure still can be applied in a package process. On the other hand, the polymer substrate 11 has a larger coefficient of thermal expansion, and thus the reliability of the high frequency flip chip package structure can be enhanced by the encapsulation process.

2. Reliability Test

Figure 7:
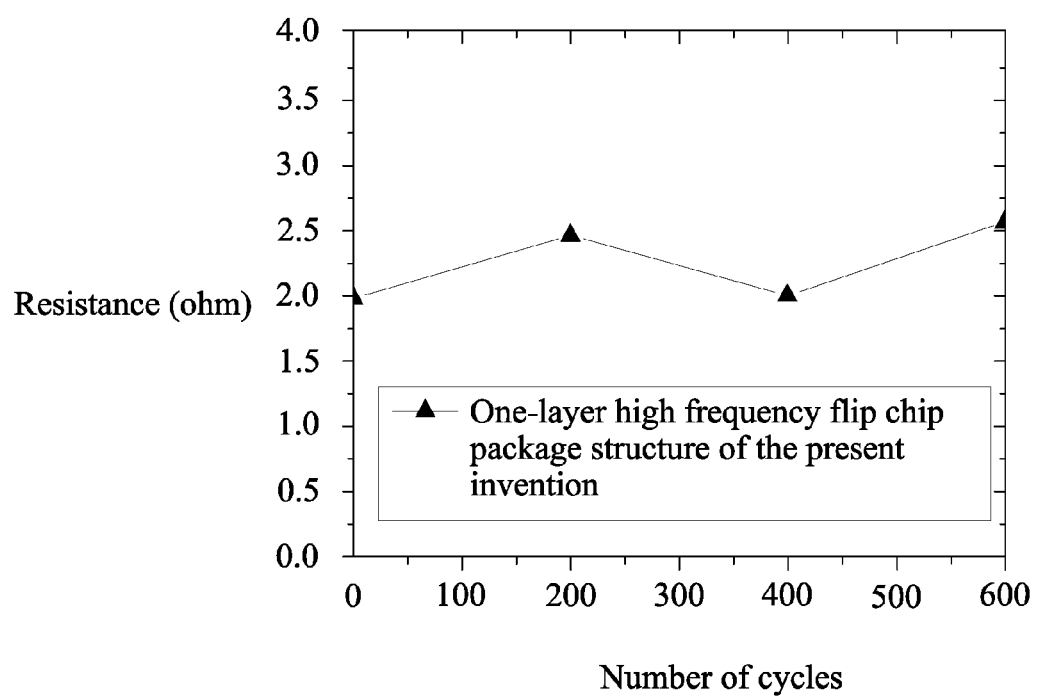
FIG. 7 shows measured results of a reliability test of a one-layer high frequency flip package structure in accordance with the present invention.

A high frequency flip package structure 1 produced by the one-layer high frequency flip chip package process in accordance with the present invention is used for performing a reliability test of a thermal cycle. With reference to FIGS. 4 and 7, a contact resistance is measured to obtain a reliability test result, after going through 0, 200, 400 or 600 cycles, the high frequency flip chip package structure 1 has excellent thermal stability and reliability, showing that the under-fill 14 can effectively reduce the thermal stress caused by the large difference between of the coefficients of thermal expansion of the chip 13 and the polymer substrate 11, and thus the high frequency flip package structure 1 is applicable for packaging high frequency components used in the microwave industry.

Unlike the conventional two-layer high frequency flip chip package process and high frequency flip chip package structure 2, the one-layer high frequency flip chip package process and the high frequency flip chip package structure 1 in accordance with the present invention has the following advantages:

1. The present invention is novel and improves over the prior art. Since the conventional two-layer high frequency flip chip package process goes through the two-layer package process to produce a high frequency flip chip package structure 2 with a high-frequency characteristic that results in additional insertion loss and return loss, requires a complicated procedure, and causes a reliability issue. On the other hand, the manufacturing process of the present invention can overcome the aforementioned shortcomings effectively.

2. The present invention is useful. Since the conventional two-layer high frequency flip chip package process uses a two-layer package process and a ceramic substrate 23, the conventional method incurs a high cost, but the present invention simply goes through a one-layer package, and also uses a low-cost polymer substrate 11 to greatly lowering the cost of the conventional two-layer high frequency flip chip package process.

What is claimed is:

1. A high frequency flip chip package structure of a polymer substrate, comprising:
   a polymer substrate;
   a coplanar waveguide transmission line, installed on a surface of the polymer substrate, for transmitting a telecommunication signal;
   at least one bump, with an end coupled to a surface of the polymer substrate;
   a chip, coupled to another end of the bump;
   an under-fill, filled between the chip and the polymer substrate and the bumps to form a space.

2. The high frequency flip chip package process of a polymer substrate as recited in claim 1, wherein the polymer substrate is a polymer board used for high frequency.

3. The high frequency flip chip package process of a polymer substrate as recited in claim 1, wherein the bump is formed selectively by an electroplating method and a metal deposition method.

4. The high frequency flip chip package process of a polymer substrate as recited in claim 1, wherein the under-fill is a polymer selected from the collection of epoxy-based benzocyclobutene, liquid crystal polymer and high frequency under-fill.

5. The high frequency flip chip package process of a polymer substrate as recited in claim 1, wherein the under-fill is filled into the space between the chip, the polymer substrate and the bump space by a capillary method.

* * * * *